United States Patent [19]

Kira

[11] Patent Number: 5,235,271
[45] Date of Patent: Aug. 10, 1993

[54] SYSTEM AND METHOD FOR TESTING MANUFACTURED LOTS OF ELECTRONIC DEVICES

[75] Inventor: Hideshi Kira, Kitakyushu, Japan

[73] Assignee: Kabushiki Kaisha Toshiba, Kawasaki, Japan

[21] Appl. No.: 578,602

[22] Filed: Sep. 7, 1990

[30] Foreign Application Priority Data

Sep. 8, 1989 [JP] Japan .................................. 1-233402

[51] Int. Cl.$^5$ ........................................... G01R 31/02
[52] U.S. Cl. ................... 324/158 R; 324/73.1
[58] Field of Search ............. 324/158 R, 73.1, 158 F; 371/15.1, 25.1; 437/8; 364/554, 551.01, 481

[56] References Cited

U.S. PATENT DOCUMENTS

| | | | |
|---|---|---|---|
| 3,084,326 | 4/1963 | Mitchell | 324/158 R |
| 3,526,836 | 9/1970 | Deger et al. | 324/73.1 |
| 4,242,751 | 12/1980 | Henckels et al. | 324/73.1 |
| 4,768,195 | 8/1988 | Stoner et al. | 324/73.1 |
| 4,985,673 | 1/1991 | Horie | 324/73.1 |

*Primary Examiner*—Vinh Nguyen
*Attorney, Agent, or Firm*—Finnegan, Henderson, Farabow, Garrett & Dunner

[57] ABSTRACT

An apparatus for testing semiconductor IC chips including a first tester, a second tester, a test program control section, and a distribution control section. The test program control section supplies data representing a plurality of test items, to the first tester. The first tester determines the characteristics of the semiconductor IC chips of each lot, for each test item. The data representing the characteristics of the IC chips, thus determined for each test item, is supplied to the distribution control section. The distribution control section finds the distribution of the characteristics of the IC chips, and determines whether the distribution is within a predetermined range. If the characteristic distribution is within the range, the distribution control section supplies data representative of the number assigned to the test item to the test program control section, and the test program control section, then deletes the test item corresponding from data supplied to the second tester. The data representing the remaining test items is supplied from the test program control section to the second tester. The second tester tests the IC chips for only the undeleted test items.

22 Claims, 4 Drawing Sheets

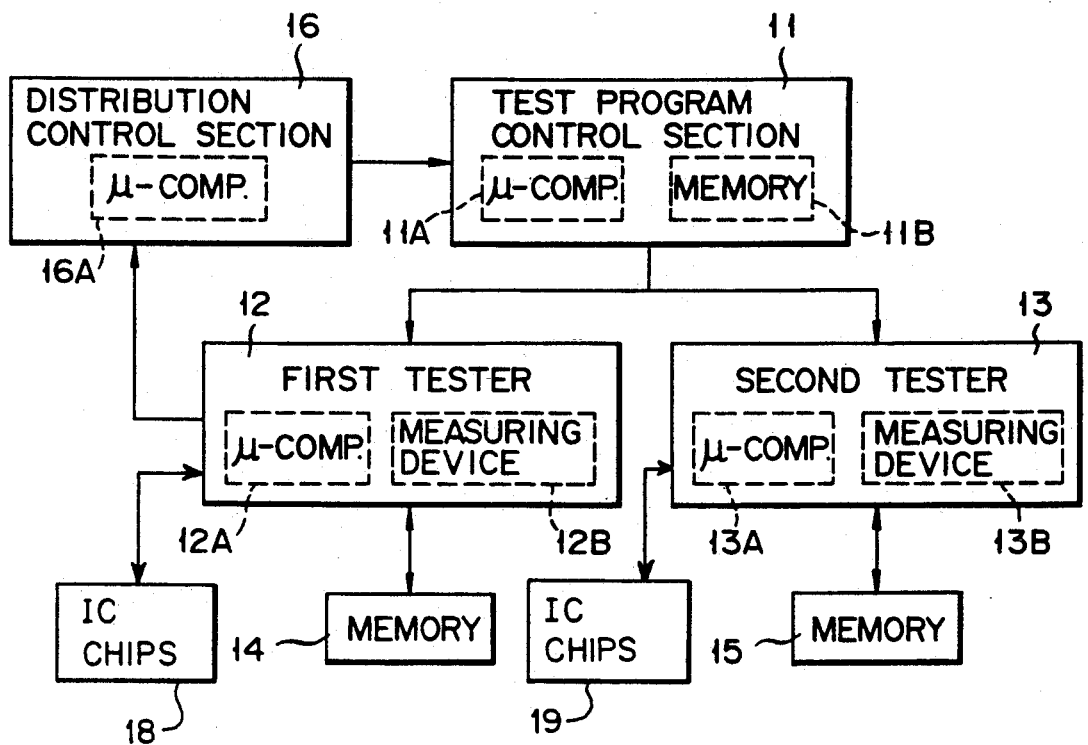
F I G. 2
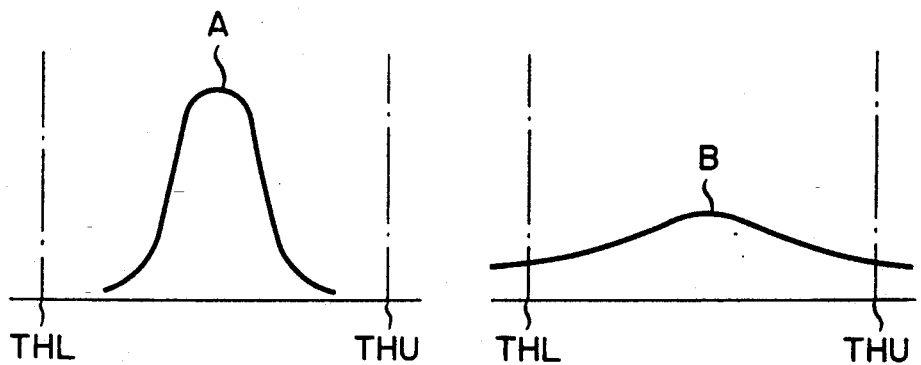
F I G. 3A    F I G. 3B

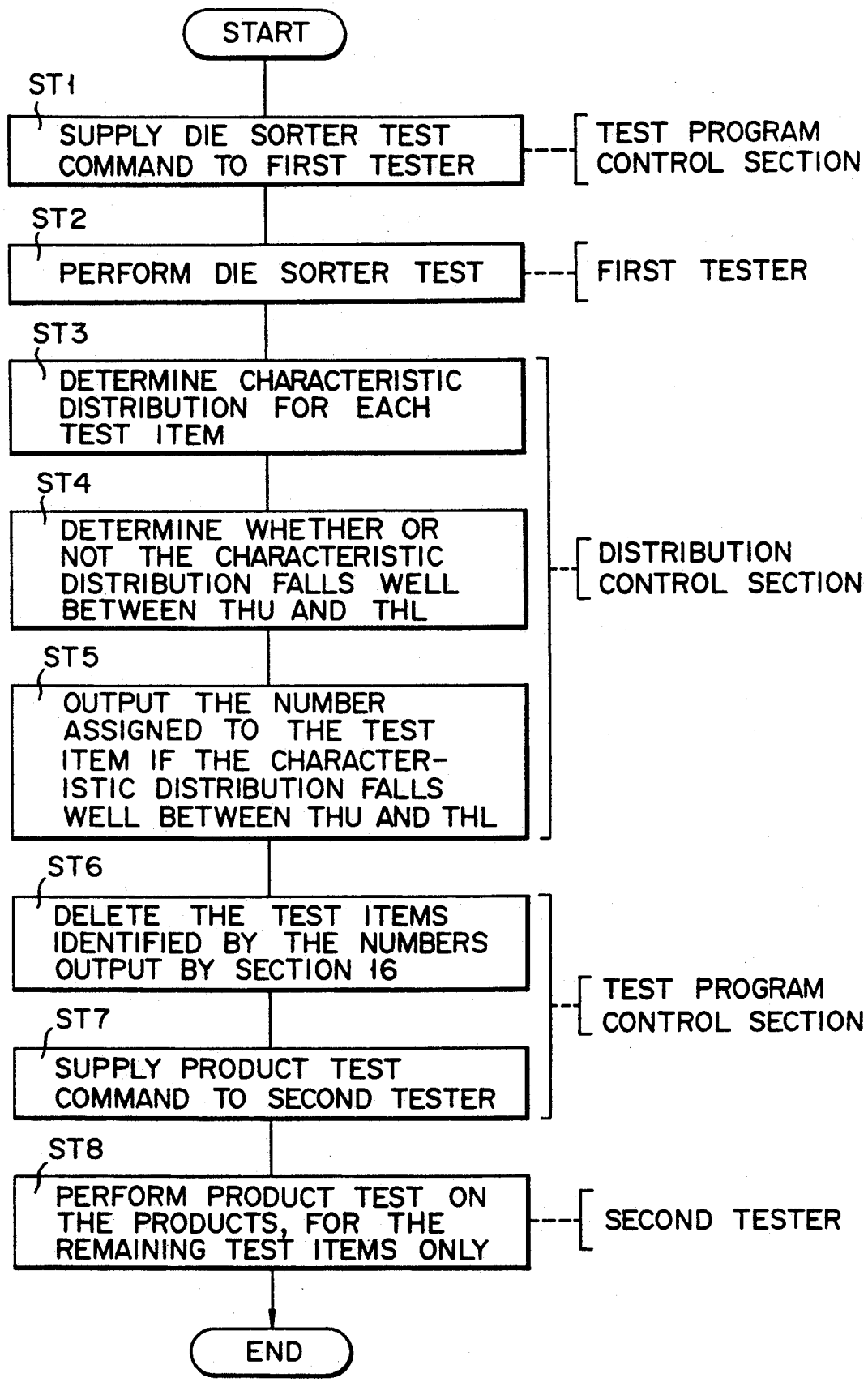
F I G. 4

SYSTEM AND METHOD FOR TESTING MANUFACTURED LOTS OF ELECTRONIC DEVICES

BACKGROUND OF THE INVENTION

1. Field of the Invention

The present invention relates to an apparatus for testing electronic devices such as semiconductor devices.

2. Description of the Related Art

As is shown in FIG. 1, a method of manufacturing a semiconductor integrated circuit (IC) comprises two major steps. The first major step includes the pre-processing step 1 of forming IC chips on a semiconductor wafer. The second major step includes the post-processing step 3 of sealing each IC chip within a package made of resin, thus forming a semiconductor device. The pre-processing step 1 is followed by a step 2 known as "die sorter test," in which the IC chips are tested, lot by lot. The post-processing step 3 is followed by a step 4 known as "product test," in which the semiconductor devices are tested, lot by lot. Further, a step 5, or a random-sampling test, is carried out after the product test to determine the quality of some selected ones of the semiconductor devices.

More specifically, the die sorter test includes a DC test for checking the static characteristics of the IC chips, and an AC test for determining the gains and noises of the amplifiers incorporated in each IC chip. The IC chips, which have passed the die sorter test, are subjected to the post-processing step 3, and made into semiconductor devices. A DC test and an AC test, both similar to those conducted in the die sorter test, are performed in both the product test and the random-sampling test.

A so-called "semiconductor tester" is used in all tests mentioned above. The semiconductor tester is controlled in accordance with the test programs, each test program being prepared for testing semiconductor devices of a specific type.

The die sorter test, the product test, and the random-sampling test are carried out on IC chips and semiconductor devices, lot by lot. Hence, the products of any lot which is subjected to the random-sampling test, as well as the die sorter test and the product test, undergo the same test three times. These tests are conducted, each for 100 to 500 items, since most semiconductor devices being manufactured at present have various functions to perform and have complex circuit structure. Further, a complex and, hence, expensive instrument is needed to check each item of test. Hence, the cost of testing the devices is substantial, and is reflected in the price of the devices.

A possible method of reducing the test cost is to reduce the number of test items. If this method is used, however, the ratio of defective and unreliable products will increase.

SUMMARY OF THE INVENTION

The object of the present invention is to provide an apparatus which tests electronic devices in a small number of steps, without unduly degrading the reliability of the test, thus performing a small number of test items on each device.

To achieve the above object, there is provided an apparatus for testing electronic devices, said apparatus comprising:

first and second test means for determining the characteristics of electronic devices, test item by test item;

distribution control means for determining the distribution of the device characteristics for each test item, from the device characteristics determined by the first test means, and for determining whether or not the distribution of the device characteristics for each test item falls well within a predetermined range; and control means for deleting any test item for which the distribution of the device characteristics falls well within the predetermined range, from the test items for which the second test means is to determine the characteristics of the electronic devices.

When the distribution control means determines that the distribution of the device characteristics for any test item is far less than the predetermined value, the test item deleting means deletes this test item from the test items for which said second test means is to determine the characteristics of the electronic devices. Hence, it suffices for the second characteristic-determining means to determine the device characteristics for the remaining test items only. Since the number assigned to test items for which the electronic devices must be tested by means of the second test means is reduced, without degrading the reliability of the test, the number assigned to test steps which must be carried out is small.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a block diagram showing an apparatus according to a preferred embodiment of the invention;

FIGS. 3A and 3B are characteristic diagrams explaining the operation of the distribution control section of the apparatus illustrated in FIG. 2;

FIG. 4 is a flow chart explaining how the apparatus of FIG. 2 operates; and

DETAILED DESCRIPTION OF THE PREFERRED EMBODIMENTS

Figure 1:
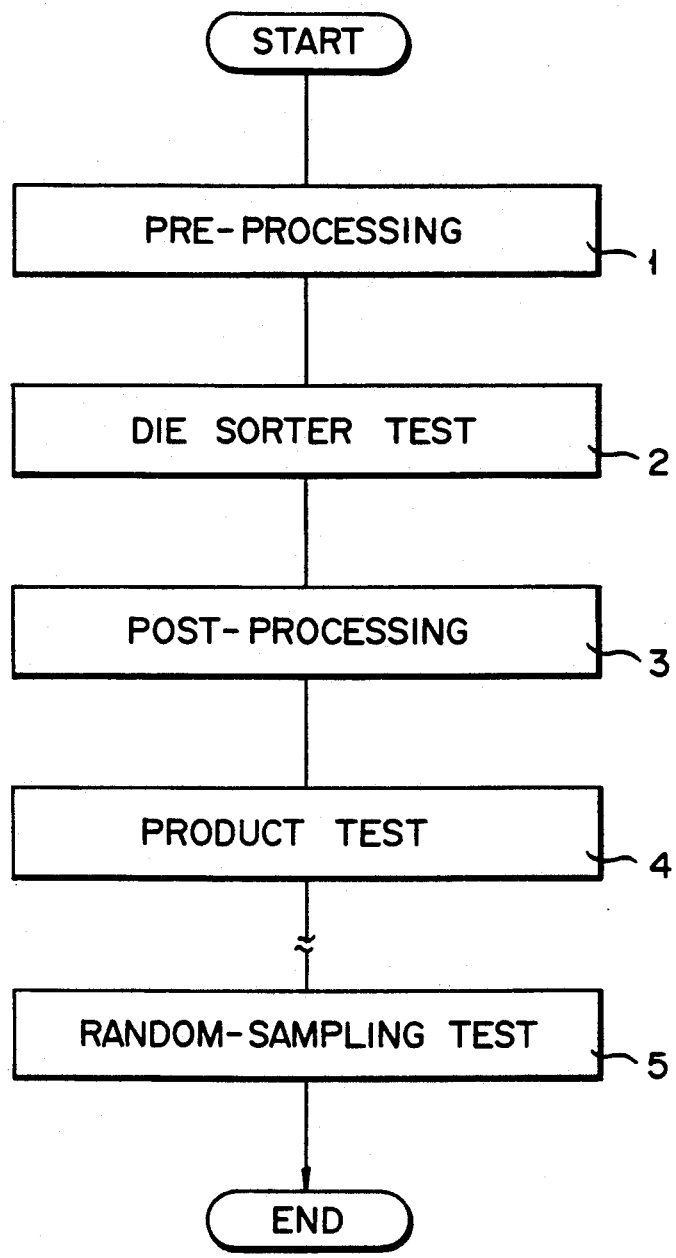
FIG. 1 is a flow chart illustrating a sequence of steps of manufacturing semiconductor devices.

A test apparatus according to an embodiment of this invention will be described, with reference to the accompanying drawings.

FIG. 2 is a schematic representation of the test apparatus. As this figure shows, the test apparatus comprises a test program control section 11, two testers 12 and 13, two memories 14 and 15, and a distribution control section 16.

The test program control section 11 is designed to control a die sorter test program and a product test program, and comprises a microcomputer 11A and a memory 11B. The testers 12 and 13 are connected to the test program control section 11. The first tester 12 comprises a microcomputer 12A and a measuring device 12B, and performs the die sorter test on IG chips 18. More specifically, the microcomputer 12A controls the measuring device 12B in accordance with the die sorter test program stored in the memory 11B. The second tester 13 comprises a microcomputer 13A and a measuring device 13B, and performs the product test. More specifically, the microcomputer 13A controls the measuring device 13B in accordance with the product test program stored in the memory 11B. The test that either tester performs includes a DC test for checking the static characteristics of IC chips 18, and an AC test for determining the gains and noises of the amplifiers incorporated in each IC chip.

The memories 14 and 15 are connected to the testers 12 and 13, respectively. A test program is loaded into these memories 14 and 15 from the test program control section 11 through the testers 12 and 13. The test program contains data representing 100 to 500 test items which the testers 12 and 13 are to perform. The microcomputers 12A and 13A control the measuring devices 12B and 13B, respectively, in accordance with the test program, whereby the testers 12 and 13 carry out the test items on the IC chips.

The distribution control section 16 is connected to the first tester 12, and also to the test program control section 11. This section 16 comprises, among other things, a microcomputer 16A, and is designed to find the distribution of the characteristics of the IC chips, for any test item, and to determine whether or not the characteristic distribution is far less than the predetermined value. If the characteristic distribution for any test item is less than the predetermined value, the section 16 outputs data representative of the number assigned to that test item. The data output by the distribution control section 16 is supplied to the test program control section 11.

The distribution control section 16 determines the distribution of the characteristics of the IC chips belong to each lot, which the first tester 12 has detected for the test item A. If the characteristic distribution falls well between preset upper and lower limits THU and THL, as is illustrated in FIG. 3A, that is, if the characteristic of every IC chip of the lot falls within the prescribed range, the characteristic of the IC chips of this lot are considered not to change for the test item A, even after the IC chips are subjected to a post-processing. Hence, the product test will not be performed on the lot for the test item A after the post-processing. The distribution control section 16 therefore outputs data which represents the number assigned to the test item A.

Then, the distribution control section 16 determines the distribution of the characteristics of the IC chips belong to each lot, which the first tester 12 has detected for the test item B. If the characteristic distribution does not falls between the preset upper and lower limits THU and THL, as is illustrated in FIG. 3B, that is, if the characteristic of some of the IC chips of the lot falls outside the prescribed range, the characteristics of these IC chips are considered to change for the test item B during the post-processing. Hence, the product test needs to be performed on the lot for the test item B after the post-processing. The distribution control section 16 therefore outputs no data represents the number assigned to the test item B.

The distribution control section 16 can be replaced either by the microcomputer 11A of the test program control section 11 or by the microcomputer 12A of the first tester 12.

The operation of the test apparatus shown in FIG. 2 will now be explained, with reference to the flow chart of FIG. 4.

In order to conduct a die sorter test on IC chips of a certain lot A, which have been subjected to the pre-processing, the test program control section 11 supplies the die sorter test program and a test command to the first tester 12 in step ST1. Then, in step ST2, the, first tester 12 writes the die sorter test program, which contains data designating test items, into the memory 14, and the microcomputer 12A controls the measuring device 12B in accordance with the test program, whereby the die sorter test is performed on the IC chips of the lot A, for first test item. In step ST3, the data showing the characteristics of the IC chips detected by the device 12B is supplied to the distribution control section 16, and the section 16 determines the distribution of the IC chip characteristics, for each test item. In step ST4, the section 16 determines whether or not the characteristic distribution falls well between the limits THU and THL. If YES, the section 16 outputs data, which represents the number assigned to the first test item, to the test program control section 11 in step ST5.

Steps ST2 to ST5 are repeated until the distribution section 16 determines the distribution of the characteristics of the IC chips which the measuring device 12B have detected for the last test item.

Thereafter, the flow goes to step ST6, in which the test program control section 11 deletes the test items, which are identified by the numbers supplied from the the section 16, from the product test program to be supplied from the memory 11B to the second tester 13. This operation of deleting the test items will be explained, with reference to FIG. 5.

Figure 5:
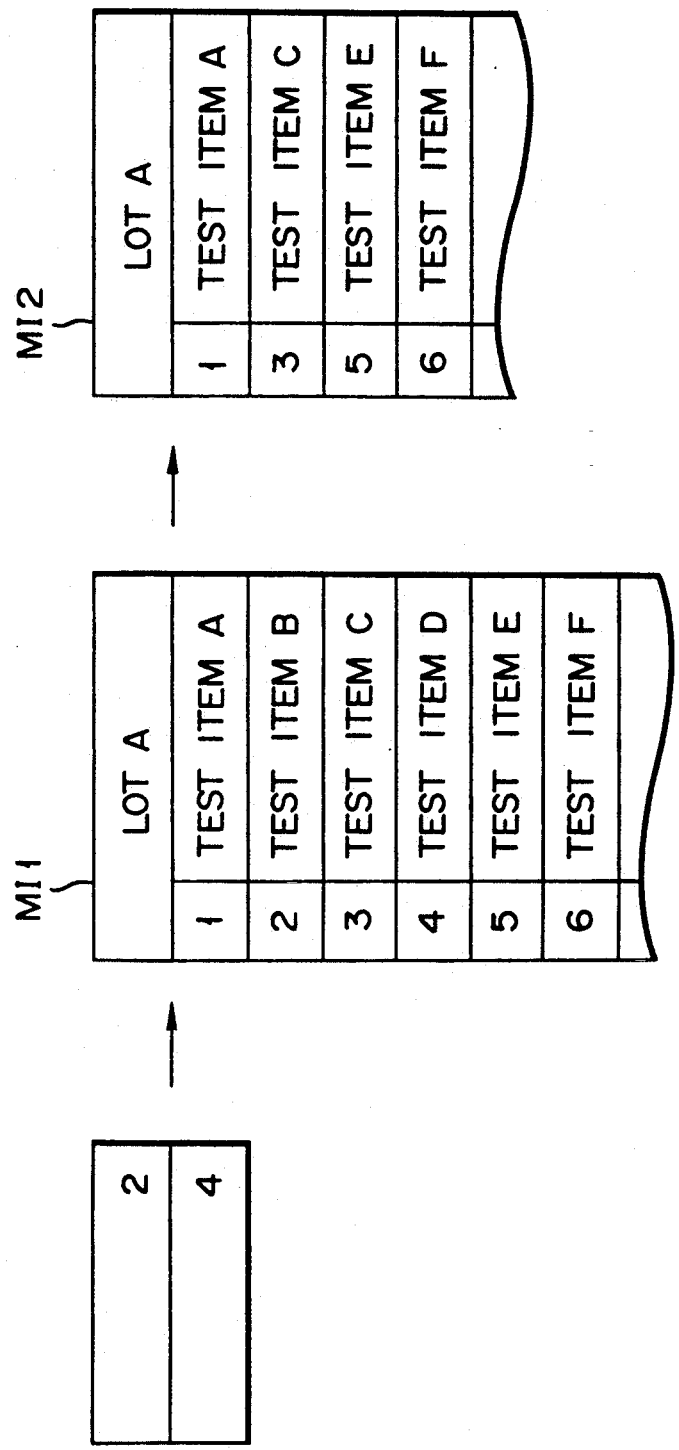
FIG. 5 is a diagram explaining the operation of the test program control section of the apparatus shown in FIG. 2.

MI1 shown in FIG. 5 is a table of test items A, B, C, ..., which is stored in the memory 11B and which has been supplied to the first tester 13. If the numbers "2" and "4" are supplied from the distribution control section 16 to the test program control section 11, the section 11 deletes the test items B and D identified by the numbers "2" and "4". As a result, the table MI1 changes to a table MI2 which contains the remaining test items A, C, E, F, ....

Then, the flow goes to step ST7, in which the test program control section 11 supplies the product test program including the table MI2 (FIG. 5) to the second tester 13, along with a test command. In step ST8, the product test program is stored into the memory 15, and the microcomputer 13A controls the measuring device 13B in accordance with the product test program, whereby the product test is performed on the IC chips of the lot A, for only the test item contained in the table MI2 (FIG. 5).

As has been described above, the test program control section 11 deletes from the table MI1 (FIG. 5) the test items for which the characteristic distributions determined by the section 16 are somewhere between the the lower limit THL and the upper limit THU, and supplies only the remaining test items, i.e., those contained in the table MI2 (FIG. 5), to the second tester 13. The second tester 13 performs the product test on the IC chips of the lot A, but for only the remaining test items, and can finish the test in a shorter time than it would take to finish a test containing all the test items.

In theory, the IC chips, whose characteristic distribution determined for a certain test item falls well between the limits THU and THL, are considered to have their characteristics changed during the post-processing. Hence, even if they are not subjected to the product test for said test item, the quality of these IC chips can be guaranteed.

The present invention is not limited to the embodiment described above. For instance, the second tester 13, not the test program control section 11, may delete some test items from the table MI1. Further, the test program control section may have a minicomputer, instead of a microcomputer.

In the embodiment described above, the product test is performed on products for less test items than those for which the die sorter test has been carried. Nevertheless, the present invention can also be applied to a random-sampling test.

What is claimed is:

1. A system for testing a set of electronic devices, comprising:
   means for storing a plurality of test items, each test item specifying a device characteristic to be determined;
   first means for determining characteristics of the set of devices in accordance with the plurality of test items, by determining a characteristic of each of a plurality of devices in the set of devices;
   second means, responsive to the storing means and the first determining means, for determining selected ones of the test items in accordance with determined characteristics of the set of devices; and
   means for testing the set of devices in accordance with the selected ones of the test items.

2. A system according to claim 1, wherein said second determining means includes
   means for determining a distribution of the device characteristic corresponding to each test item; and
   means for determining the selected ones of the test items to be those test items for which the corresponding distribution is outside of a predetermined range.

3. A system according to claim 2, wherein the first determining means includes
   second means for testing electronic devices in accordance with the test items.

4. An apparatus according to claim 1, further comprising a memory means connected to said first test means, for storing data representing a plurality of test items.

5. An apparatus according to claim 1, further comprising a memory means connected to said testing means.

6. A system according to claim 1, wherein said first determining means includes means for determining characteristics of semiconductor integrated circuit devices, and said testing means includes means for testing semiconductor integrated circuit devices.

7. A system according to claim 1, wherein the first determining means includes
   second means for testing electronic devices in accordance with the test items.

8. A system for processing a set of electronic devices, the system being adapted for modifying a list of test items, comprising:

first means for determining characteristics of the set of devices in accordance with a plurality of test items, each test item specifying a device characteristic to be determined, by determining a characteristic of each of a plurality of devices in the set of devices;
second means, responsive to the first means, for determining a distribution of the device characteristic corresponding to each test item, and for determining whether the distribution of the device characteristic is within a predetermined range; and
third means, responsive to the second determining means, for deleting, from the list of test items, a test item for which the corresponding distribution of the device characteristic is within the predetermined range.

9. A system according to claim 8, wherein said third means has memory means for storing data representing a plurality of test items.

10. A system according to claim 8, further comprising memory means connected to said first determining means, for storing data representing a plurality of test items.

11. A system according to claim 8, wherein said first determining means includes means for determining characteristics of semiconductor integrated circuit devices.

12. A system according to claim 11, wherein the first determining means includes
    means for testing electronic devices in accordance with the test items.

13. A system according to claim 8, wherein the first determining means includes
    means for testing electronic devices in accordance with the test items.

14. A system for testing a set of semiconductor devices, comprising:
    means for storing a plurality of test items, each test item specifying a device characteristic to be determined;
    first means for testing characteristics of each of the semiconductor devices, in accordance with the plurality of test items, by testing a characteristic of each of a plurality of devices in the set of devices;
    means, responsive to the first testing means, for determining a distribution of the device characteristic corresponding to each test item, and for determining whether the distribution of the device characteristic is within a predetermined range;
    second means for testing characteristics of each of the semiconductor devices; and
    means, responsive to the storing means and to the determining means, for supplying, to the second testing means, test items having a corresponding distribution characteristic outside of the predetermined range.

15. A method for testing the characteristics of a set of semiconductor devices, comprising the steps of:
    storing a plurality of test items, each test item specifying a device characteristic to be determined;
    a first step of determining characteristics of the set of devices in accordance with the plurality of test items, by testing a characteristic of each of a plurality of devices in the set of devices;
    a second step of determining selected ones of the test items in accordance with determined characteristics of the set of devices; and testing the set of devices in accordance with the selected ones of the test items.

16. A method according to claim 15, wherein the first determining step includes the substep of testing the characteristics of the set of devices.

17. A method according to claim 16, wherein the second determining step includes the substeps of
determining a distribution of the device characteristic corresponding to each test item, and
determining whether the distribution of the device characteristic is within a predetermined range.

18. A method of processing a set of unpackaged semiconductor devices, comprising the steps of:
storing a plurality of test items, each test item specifying a device characteristic to be determined;
a first step of determining characteristics of the set of unpackaged semiconductor devices in accordance with the plurality of test items;
packaging each of the unpackaged semiconductor devices to produce a set of packaged devices;
a second step of determining, responsive to the storing step and to the first determining step, selected ones of the test items in accordance with determined characteristics of the set of unpackaged semiconductor devices; and
testing the set of packaged devices in accordance with the selected ones of the test items.

19. A method according to claim 18, wherein the first determining step includes the substep of
testing the characteristics of the set of devices.

20. A method according to claim 19, wherein the second determining step includes the substeps of
determining a distribution of the device characteristic corresponding to each test item, and
determining whether the distribution of the device characteristic is within a predetermined range.

21. A method according to claim 20, wherein the testing step includes the substep of
performing random testing.

22. A system for testing a set of semiconductor devices, comprising:
means for storing a plurality of test items, each test item specifying a device characteristic to be determined;
first means for measuring characteristics of each of the semiconductor devices, in accordance with the plurality of test items, the first measuring means including
a memory for storing a test program;
means, responsive to the first measuring means, for determining a distribution of the device characteristic corresponding to each test item, and for determining whether the distribution of the device characteristic is within a predetermined range, the determining means including a computer;
second means for measuring characteristics of each of the semiconductor devices, the second measuring means including a memory for storing a test program; and
means, responsive to the storing means and to the determining means, for supplying, to the second measuring means, test items having a corresponding distribution characteristic outside of the predetermined range.

* * * * *